(12) United States Patent
Chang et al.

(10) Patent No.: US 8,810,885 B2
(45) Date of Patent: Aug. 19, 2014

(54) COATED ARTICLE AND METHOD FOR MAKING THE SAME

(75) Inventors: Hsin-Pei Chang, New Taipei (TW);
Wen-Rong Chen, New Taipei (TW);
Huann-Wu Chiang, New Taipei (TW);
Cheng-Shi Chen, New Taipei (TW); Jia Huang, Shenzhen (CN)

(73) Assignees: Hong Fu Jin Precision Industry (SheZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 386 days.

(21) Appl. No.: 13/247,019

(22) Filed: Sep. 28, 2011

(65) Prior Publication Data

US 2012/0275006 A1 Nov. 1, 2012

(30) Foreign Application Priority Data

Apr. 27, 2011 (CN) .......................... 2011 1 0106724

(51) Int. Cl.
*G02B 5/23* (2006.01)

(52) U.S. Cl.
USPC ......................................... 359/241

(58) Field of Classification Search
USPC ......... 359/241, 359, 634, 580, 585, 589, 722; 351/159.61; 65/30.11
See application file for complete search history.

(56) References Cited

U.S. PATENT DOCUMENTS

2010/0177380 A1* 7/2010 Nagahama et al. ........... 359/359

* cited by examiner

*Primary Examiner* — Joseph P Martinez
(74) *Attorney, Agent, or Firm* — Novak Druce Connolly Bove + Quigg LLP

(57) ABSTRACT

A coated article is described. The coated article includes a substrate; and a photochromic layer formed on the substrate. The photochromic layer is a titanium layer doped with metal element 'M'. The element 'M' is selected from a group consisting of nickel, iron, and chromium. A method for applying the photochromic layer to the substrate is also described.

13 Claims, 2 Drawing Sheets

COATED ARTICLE AND METHOD FOR MAKING THE SAME

BACKGROUND

1. Technical Field

The present disclosure relates to a coated article, and a method for making the article.

2. Description of Related Art

Photochromism is the reversible transformation of chemical species between two forms by the absorption of electromagnetic radiation upon exposure to light, where the two forms have different absorption spectra. Photochromism can take place in both organic and inorganic compounds, and mainly organic compounds such as azo compounds and diarylethene. However, the organic compounds are prone to being nullified by corrosives such as acid and alkali, salt spray corrosion, ultraviolet irradiation, and heat, thus the organic compounds commonly have poor stabilities and short lifetimes.

Therefore, there is room for improvement within the art.

BRIEF DESCRIPTION OF THE FIGURES

Many aspects of this disclosure can be better understood with reference to the following figures. The components in the figure are not necessarily drawn to scale, the emphasis instead being placed upon clearly illustrating the principles of the disclosure. Moreover, in the drawings like reference numerals designate corresponding parts throughout the several views.

DETAILED DESCRIPTION

Figure 1:
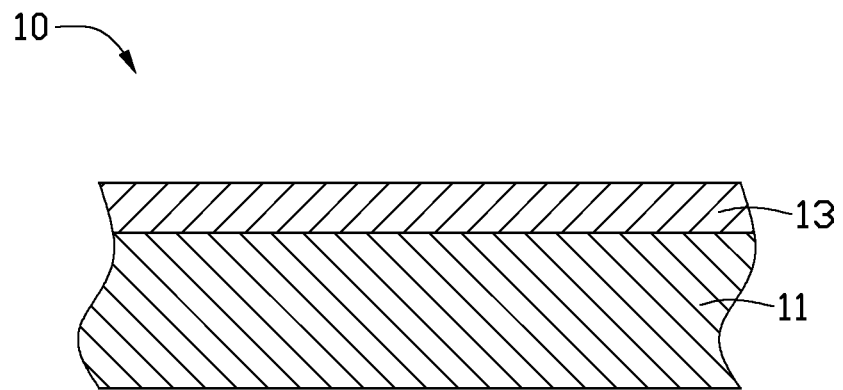
FIG. 1 is a cross-sectional view of an exemplary embodiment of a coated article.

FIG. 1 shows a coated article 10 according to an exemplary embodiment. The coated article 10 includes a substrate 11, and a photochromic layer 13 formed on a surface of the substrate 11.

The substrate 11 may be made of glass or stainless steel, but is not limited to glass and stainless steel.

The photochromic layer 13 may be formed by vacuum sputtering and has a thickness of about 200 nm-500 nm. The photochromic layer 13 is a titanium dioxide ($TiO_2$) layer doped with metal element 'M'. The element 'M' is selected from a group consisting of nickel (Ni), iron (Fe), and chromium (Cr). The atomic ratio between the element 'M' and Ti within the photochromic layer 13 may be about 1:50-2:25.

The photochromic layer 13 has a photochromic property. When not irradiated or exposed to light, the photochromic layer 13 is colorless. When irradiated or exposed to light, the $TiO_2$ contained in the photochromic layer 13 will absorb the light energy and release active oxygen to oxidize the element 'M' to form high oxides, as such, the color of the photochromic layer 13 changes to brown. The photochromic property of the photochromic layer 13 is reversible. When the irradiation stops, the high oxides will be reduced to element 'M' and the photochromic layer 13 returns to colorless.

A method for making the coated article 10 may include the following steps:

The substrate 11 is pre-treated, such pre-treating process may include degreasing the substrate 11, dewaxing the substrate 11, and rinsing the substrate 11 in deionized water and then dried.

Figure 2:
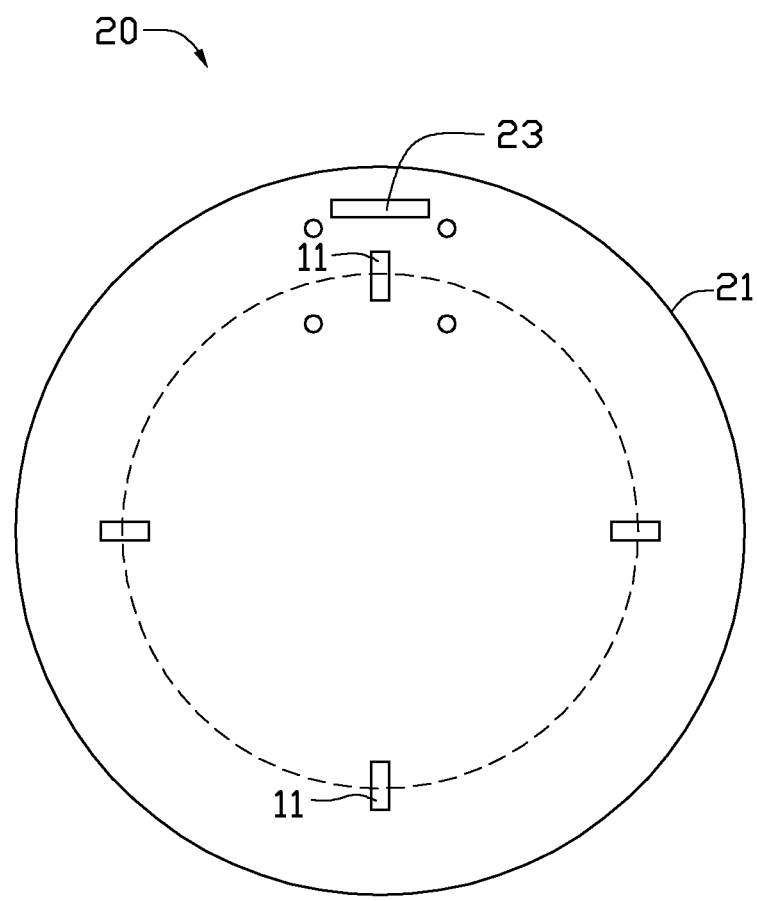
FIG. 2 is an overhead of an exemplary embodiment of a vacuum sputtering device.

The photochromic layer 13 may be magnetron sputtered on the pretreated substrate 11. Referring to FIG. 2, the substrate 11 may be positioned in a coating chamber 21 of a vacuum sputtering device 20. The coating chamber 21 is fixed with an alloy target 23.

The alloy target 23 contains titanium and metal element 'M'. The element 'M' is selected from a group consisting of Ni, Fe, and Cr. The atomic ratio between the element 'M' and Ti in the photochromic layer 13 may be about 1:20-1:10. The alloy target 23 may be formed by a method as follows:

Titanium powder and metal element 'M' powder are mixed to obtain a mixture. The titanium powder has a purity of more than 99.99% and an average particle size of about 25 μm-50 μm. The element 'M' powder has a purity of more than 99.99% and an average particle size of about 25 μm-50 μm. The mixture is then hot isostatic pressed at about 100° C.-300° C. and under a pressure of about 30 MPa-60 MPa to form a semi-finished product. The semi-finished product is sintered for about 30 minutes (min) to 60 min at a temperature of about 1300° C.-1800° C. and then cooled to form the alloy target 23.

The coating chamber 21 is evacuated to about $8.0 \times 10^{-3}$ Pa. The inside of the coating chamber 21 and the substrate 11 may be heated to about 100° C.-200° C. Argon (Ar) gas having a purity of about 99.999% may be used as a working gas and is fed into the coating chamber 21 at a flow rate of about 300 standard-state cubic centimeters per minute (sccm) to about 500 sccm. Oxygen ($O_2$) may be used as a reaction gas and is fed into the coating chamber 21 at a flow rate of about 50 sccm-200 sccm. A power of about 3 kilowatt (kW)-5 kW is applied to the alloy target 23, and the titanium atoms and 'M' atoms are sputtered off from the alloy target 23. The Ti atoms and oxygen atoms are mostly ionized in an electrical field in the coating chamber 21. The ionized titanium then chemically reacts with the ionized oxygen and form $TiO_2$ to deposit on the substrate 11. The element 'M' may not be completely ionized and directly deposit on the substrate 11 and dope in the $TiO_2$, as such, the photochromic layer 13 is formed. During the depositing process, the substrate 11 may have a bias voltage of about −100 V to about −200 V. Depositing of the photochromic layer 13 may take about 30 min-90 min.

Specific examples of making the coated article are described as follows. The pre-treated process in these specific examples may be substantially the same as described above, so it is not described here again. Additionally, the processes of magnetron sputtering the photochromic layer 13 in the specific examples is substantially the same as described above, and the specific examples merely emphasize the different parameters in the different processes of making the coated article 10.

Example 1

The substrate 11 is made of glass.

Forming the alloy target 23: nickel powder and titanium powder are mixed with an atomic ratio of 7:100 and then be hot isostatic pressed at 300° C. and under a pressure of 40 MPa to form a semi-finished product; the semi-finished product is sintered for 40 min at a temperature of 1300° C. and then cooled to form the alloy target 23.

Sputtering to form the photochromic layer 13 on the substrate 11: the flow rate of Ar is 400 sccm, the flow rate of $O_2$ is 100 sccm; the substrate 11 has a bias voltage of −100 V; the alloy target 23 is applied with a power of 4 kW; the internal temperature of the coating chamber 21 and the substrate 11 is 100° C.; sputtering of the photochromic layer 13 takes 30 min.

The photochromic layer 13 is a titanium dioxide layer doped with nickel. The atomic ratio between the Ni and Ti is 1:20-3:50. The photochromic layer 13 has a thickness of 325 nm. When irradiated, the color of the photochromic layer 13 changes from colorless to brown.

Example 2

The substrate 11 is made of stainless steel.

Forming the alloy target 23: iron powder and titanium powder are mixed with an atomic ratio of 6:100 and then be hot isostatic pressed at 200° C. and under a pressure of 40 MPa to form a semi-finished product; the semi-finished product is sintered for 40 min at a temperature of 1350° C. and then cooled to form the alloy target 23.

Sputtering to form the photochromic layer 13 on the substrate 11: the flow rate of Ar is 350 sccm, the flow rate of $O_2$ is 120 sccm; the substrate 11 has a bias voltage of −120 V; the alloy target 23 is applied with a power of 4 kW; the internal temperature of the coating chamber 21 and the substrate 11 is 100° C.; sputtering of the photochromic layer 13 takes 30 min.

The photochromic layer 13 is a titanium dioxide layer doped with iron. The atomic ratio between the Fe and Ti is 1:20-3:50. The photochromic layer 13 has a thickness of 350 nm. When irradiated, the color of the photochromic layer 13 changes from colorless to brown.

Example 3

The substrate 11 is made of glass.

Forming the alloy target 23: chromium powder and titanium powder are mixed with an atomic ratio of 5:100 and then be hot isostatic pressed at 300° C. and under a pressure of 50 MPa to form a semi-finished product; the semi-finished product is sintered for 40 min at a temperature of 1350° C. and then cooled to form the alloy target 23.

Sputtering to form the photochromic layer 13 on the substrate 11: the flow rate of Ar is 400 sccm, the flow rate of $O_2$ is 100 sccm; the substrate 11 has a bias voltage of −150 V; the alloy target 23 is applied with a power of 4 kW; the internal temperature of the coating chamber 21 and the substrate 11 is 100° C.; sputtering of the photochromic layer 13 takes 40 min.

The photochromic layer 13 is a titanium dioxide layer doped with chromium. The atomic ratio between the Cr and Ti is 9:200-1:20. The photochromic layer 13 has a thickness of 385 nm. When irradiated, the color of the photochromic layer 13 changes from colorless to brown.

It is believed that the exemplary embodiment and its advantages will be understood from the foregoing description, and various changes may be made thereto without departing from the spirit and scope of the disclosure or sacrificing all of its advantages, the examples hereinbefore described merely being preferred or exemplary embodiments of the disclosure.

What is claimed is:

1. A coated article, comprising:
   a substrate; and
   photochromic layer formed on the substrate, the photochromic layer being made of titanium, and doped with metal element 'M', the element 'M' being selected from a group consisting of nickel, iron, and chromium.

2. The coated article as claimed in claim 1, wherein atomic ratio between the element 'M' and titanium within the photochromic layer is about 1:50-2 25.

3. The coated article as claimed in claim 1, wherein the photochromic layer is a vacuum sputtered layer and has a thickness of about 200 nm-500 nm.

4. The coated article as claimed in claim 1, wherein the substrate is made of glass or stainless steel.

5. A method for making a coated article, comprising:
   providing a substrate;
   forming an alloy target by a hot isostatic pressing process using titanium powder and metal element 'M' powder, the element 'M' being selected from a group consisting of nickel, iron, and chromium; and
   forming a photochromic layer on the substrate by vacuum sputtering using the alloy target, the photochromic layer being a titanium layer doped with metal element 'M'.

6. The method as claimed in claim 5, wherein atomic ratio between the element 'M' and titanium within the alloy target is about 1:20-1:10.

7. The method as claimed in claim 6, wherein the element 'M' powder and the titanium powder all have a purity of more than 99.99% and an average particle sizes of about 25 μm-50 μm.

8. The method as claimed in claim 7, wherein forming the alloy target is carried out by hot isostatic pressing the element 'M' powder and titanium powder at about 100° C.-300° C. and under a pressure of about 30 MPa-60 MPa and then sintering for about 30 min-60 min at about 1300° C.-1800° C.

9. The method as claimed in claim 8, wherein forming the photochromic layer uses a magnetron sputtering process; uses argon as a working gas, the argon having a flow rate of about 300 sccm-500 sccm uses oxygen as a reaction gas, the oxygen having a flow rate of about 50 sccm-200 sccm; the alloy target is applied with a power of about 3 kW-5 kW; magnetron sputtering of the photochromic layer is conducted at a temperature of about 100° C.-200° C. and takes about 30 min-90 min.

10. The method as claimed in claim 9, wherein the substrate has a bias voltage of about −100 V to about −200 V during sputtering of the photochromic layer.

11. The method as claimed in claim 9, wherein the photochromic layer has a thickness of about 200 nm-500 nm.

12. The method as claimed in claim 5, further comprising a step of pre-treating the substrate before forming the photochromic layer.

13. The method as claimed in claim 5, wherein the substrate is made of glass or stainless steel.

\* \* \* \* \*